US006793500B1

(12) United States Patent
Budell et al.

(10) Patent No.: US 6,793,500 B1
(45) Date of Patent: Sep. 21, 2004

(54) RADIAL CONTACT PAD FOOTPRINT AND WIRING FOR ELECTRICAL COMPONENTS

(75) Inventors: Timothy W. Budell, Milton, VT (US); Esmaeil Rahmati, South Burlington, VT (US); David B. Stone, Jericho, VT (US); Jerzy M. Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/666,607

(22) Filed: Sep. 18, 2003

(51) Int. Cl.[7] ............................................. H01R 12/00
(52) U.S. Cl. ......................... 439/55; 439/66; 439/83; 439/92; 174/51; 361/799; 361/803; 317/324
(58) Field of Search ........................... 439/55, 66, 83, 439/92; 174/51; 361/799, 803; 317/324

(56) References Cited

U.S. PATENT DOCUMENTS

| | | | |
|---|---|---|---|
| 3,716,761 A | 2/1973 | Rotast | |
| 3,795,845 A | 3/1974 | Cass et al. | |
| 3,833,838 A | 9/1974 | Christiansen | |
| 4,195,195 A | 3/1980 | de Miranda et al. | |
| 4,495,377 A | 1/1985 | Johnson et al. | |
| 5,345,366 A | * 9/1994 | Cheng et al. ................ | 361/785 |
| 5,490,040 A | 2/1996 | Gaudenzi et al. | |
| 5,491,364 A | 2/1996 | Brandenburg et al. | |
| 5,841,191 A | 11/1998 | Chia et al. | |
| 6,443,739 B1 | * 9/2002 | Currie .......................... | 439/55 |
| 6,582,238 B2 | * 6/2003 | Unou et al. ................... | 439/68 |
| 6,650,019 B2 | * 11/2003 | Glenn et al. ................. | 257/777 |

FOREIGN PATENT DOCUMENTS

| | | |
|---|---|---|
| JP | 2000124259 | 4/2000 |
| JP | 2000208665 | 7/2000 |

OTHER PUBLICATIONS

Gasparini et al., A Method of Designing a Group of Bumps for C4 Packages to Maximize the Number of Bumps and Minimize the Number of Package Layers, 1994, pp. 695–699.

Milliken, JC Parslow, J, Electrode Pattern, Dec. 1968, Article 29 of 32, 1 page, TDB 12–68 p805 (Pubname).

Balyoz, J Gruodis, AJ, Densified Wiring Channels Design Concept, Dec. 1974, Article 1 of 1, 1 page, TDB 12–74, p 1958–1959 (Pubname).

* cited by examiner

*Primary Examiner*—Truc Nguyen
(74) *Attorney, Agent, or Firm*—Schmeiser, Olsen & Watts; William H. Steinberg

(57) ABSTRACT

A structure and associated method comprising contact pads on a surface of a substrate for coupling signal, power, and ground connections for an electrical device to a plurality of conductive wires on the substrate. The contact pads are formed in single lines along radial edges of sectors on the substrate. Each of the sectors comprise a predetermined angle between the radial edges of each of the sectors. The plurality of sectors collectively form a circular area. The contact pads comprise signal, power, and ground connections located at predetermined positions on the single lines along the radial edges of each of the sectors on the substrate.

17 Claims, 7 Drawing Sheets

RADIAL CONTACT PAD FOOTPRINT AND WIRING FOR ELECTRICAL COMPONENTS

BACKGROUND OF THE INVENTION

1. Technical Field

The present invention relates to a structure and associated method to wire an electrical device to a substrate.

2. Related Art

Typical electrical structures comprising electrical devices are limited in the amount of I/O connections that may be run from the electrical device to external connections on a substrate. Therefore any apparatus and method to allow more I/O connections to be run from an electrical device to external connections on a substrate would be welcome by the industry.

SUMMARY OF THE INVENTION

The present invention provides an electrical structure, comprising:

contact pads on a surface of a substrate, wherein the contact pads are adapted to couple signal, power, and ground connections for an electrical device to a plurality of conductive wires on the substrate, wherein the contact pads are formed in single lines along radial edges of sectors on the substrate, wherein each sector comprises a predetermined angle between the radial edges of each of said sectors, wherein the sectors collectively form a circular area, and wherein the contact pads comprise signal, power, and ground connections located at predetermined positions on the single lines along the radial edges of each of said sectors.

The present invention provides an electrical structure, comprising:

first contact pads on a surface of a substrate, wherein the first contact pads are adapted to couple signal, power, and ground connections for an electrical device to a first plurality of conductive wires on the substrate, wherein the first contact pads are formed in single lines along radial edges of sectors on the substrate, wherein each of the sectors comprise a predetermined angle between the radial edges of each of said sectors, wherein the sectors collectively form a quadrant in each corner of said substrate, and wherein the first contact pads comprise said signal, power, and ground connections located at predetermined positions on the single lines along the radial edges of the sectors within each quadrant; and second contact pads on the surface of a substrate, wherein the second contact pads are adapted to couple signal, power, and ground connections for said electrical device to a second plurality of conductive wires on the substrate, wherein the second contacts pads are spaced apart a first predetermined distance in a first direction, wherein the second contact pads are spaced apart a second predetermined distance in a second direction, wherein first predetermined distance is different from said second predetermined distance, wherein the first direction is perpendicular to the second direction, and wherein the first and second contact pads are located on different areas on the substrate.

The present invention provides a method for forming an electrical structure, comprising:

forming contact pads on a surface of a substrate, wherein the contact pads are adapted to couple signal, power, and ground connections for an electrical device to a plurality of conductive wires on the substrate, wherein the contact pads are formed in single lines along radial edges of sectors on the substrate, wherein each sector comprises a predetermined angle between the radial edges of each of said sectors, wherein the sectors collectively form a circular area, and wherein the contact pads comprise signal, power, and ground connections located at predetermined positions on the single lines along the radial edges of each of said sectors.

DETAILED DESCRIPTION OF THE INVENTION

Figure 1:
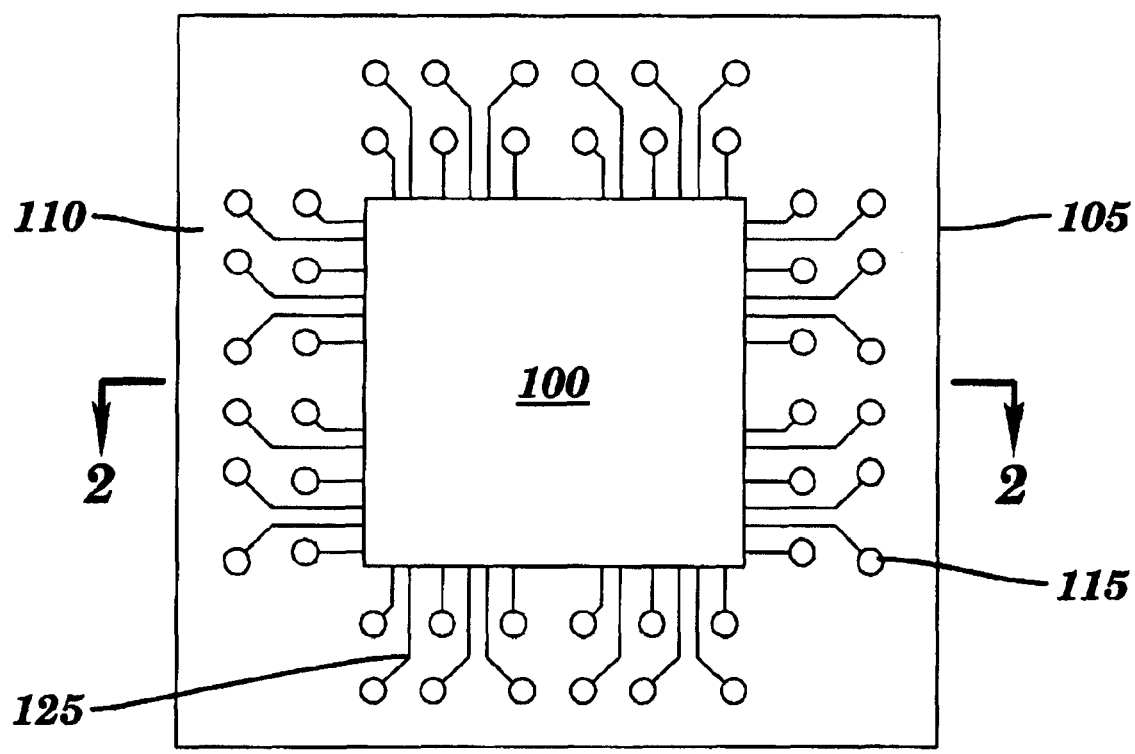
FIG. 1 is a plan view of an exemplary flip-chip module, in accordance with embodiments of the present invention.

FIG. 1 is a top view of an exemplary flip-chip module. In FIG. 1, an integrated circuit chip 100 is flip-chip mounted to a module 105 having a multiplicity of pins 115, in accordance with embodiments of the present invention. Each pin is electrically connected to a module contact pad 120 (see FIG. 2) by a conductive wire 125 within module 105. Conductive wires may also be formed on top surface 110 of module 105. Pins 115 may carry digital or analog signals, power or ground.

Figure 2:
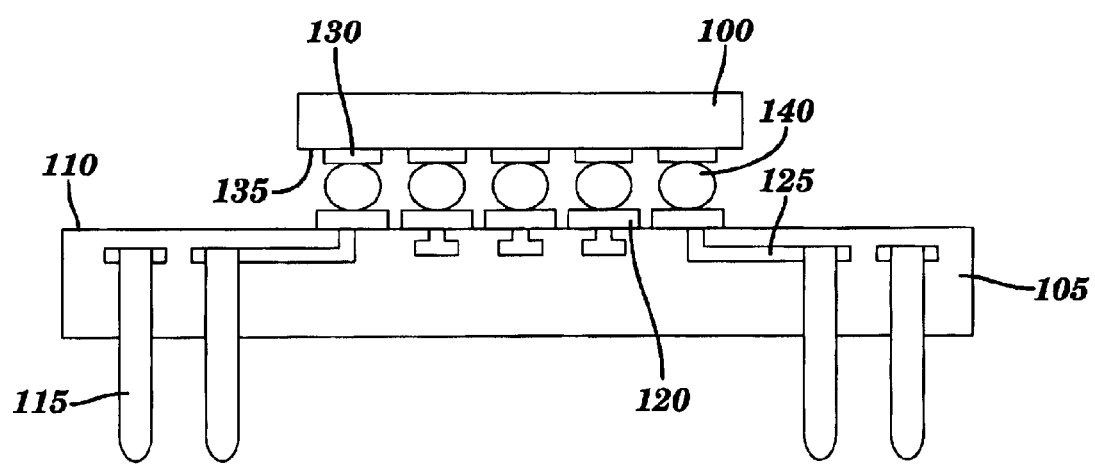
FIG. 2 is a cross-sectional view through line 2—2 of the flip chip module of FIG. 1, in accordance with embodiments of the present invention.

FIG. 2 is a cross-sectional view through line 2—2 of the flip chip module of FIG. 1, in accordance with embodiments of the present invention. FIG. 2 is at a larger scale than FIG. 1 in order to better illustrate the salient features of the interconnection between integrated circuit chip 100 and module 105. In FIG. 2, module contact pads 120 are mechanically and electrically connected to chip contact pads 130 on a top surface 135 of integrated circuit chip 100 by solder bumps, solder balls or controlled collapse chip connections (C4). The name flip-chip module as applied to the combination of integrated circuit chip 100 and module 105 is readily apparent as integrated circuit chip 100 has been "flipped" upside down so the top surface 135 of the integrated circuit chip is facing top surface 110 of module 105 in order to connect the integrated circuit chip 100 to the module.

While only one wiring layer is illustrated in FIGS. 1 and 2, the invention is applicable to modules having multiple wiring layers. For example, with two wiring layers, escaping wires in a second wiring layer would be positioned under the escaping wires of the first layer between columns of module contact pads. Alternatively, the first wiring layer may be on the surface of the module and the second wiring layer within the module. However, the invention reduces the number of wiring layers that would be required in a module from the number that would otherwise be required without the present invention as described infra. It should also be noted that while a pin grid array module has been illustrated in FIGS. 1 and 2, the present invention is applicable to other types of modules such as ball grid arrays, solder column grid arrays and land grid arrays.

Further, it should be noted that modules constitute only one type of substrate to which the present invention is applicable. Other types of substrates include but are not limited to, single wiring layer or multi-layer wiring layer integrated circuit chip modules, single wiring layer or multi-layer wiring layer printed circuit boards, single wiring layer or multi-layer wiring layer flexible circuit boards, single wiring layer or multi-layer wiring layer interposers, single wiring layer or multi-layer wiring layer ceramic substrates, single wiring layer or multi-layer wiring layer organic substrates and integrated circuit chips.

Contact pads and wires interconnecting contact pads may be formed by any number of methods well known in the art.

Figure 3:
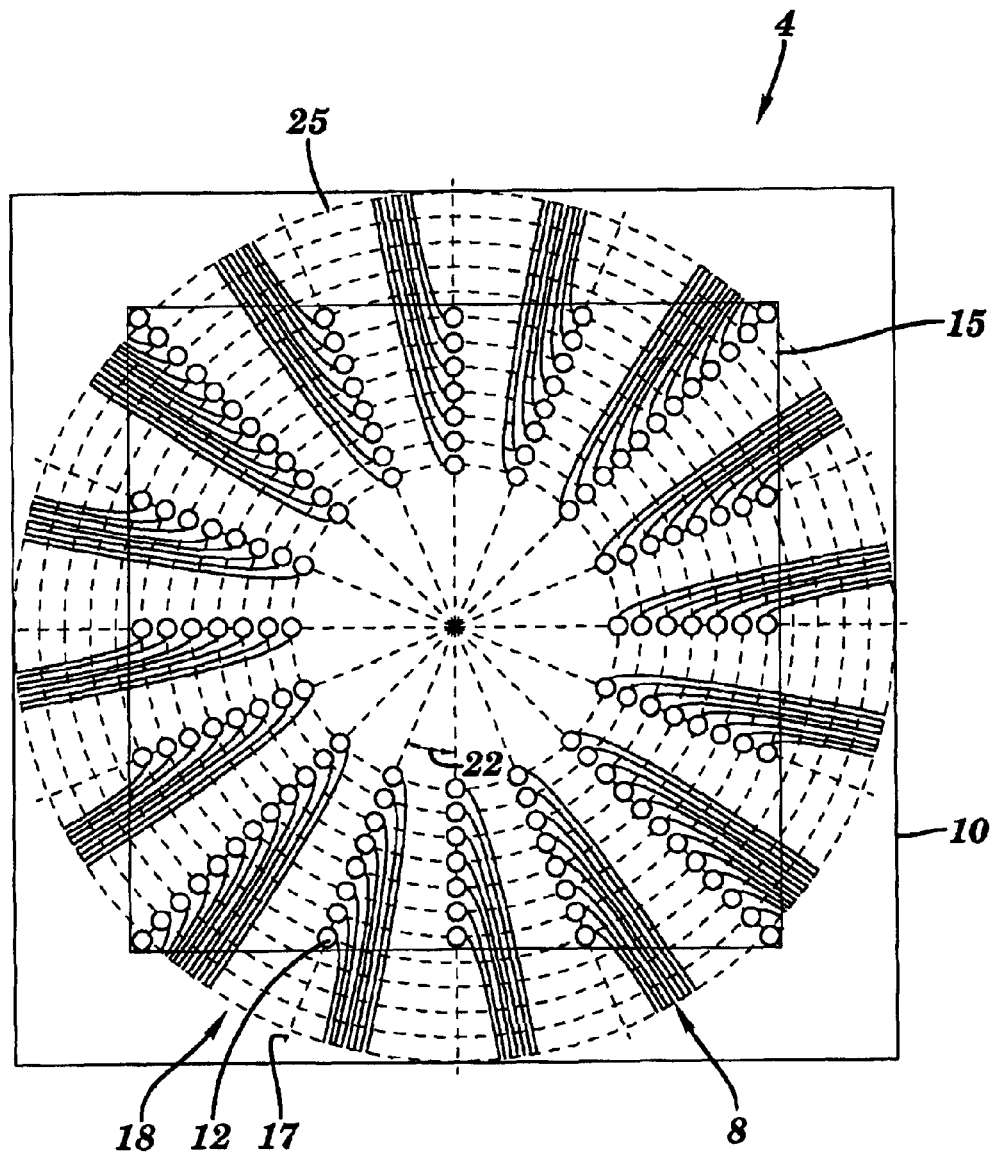
FIG. 3 illustrates a top view of an electrical structure comprising an electrical device connected to contact pads on a substrate, in accordance with embodiments of the present invention.

FIG. 3 illustrates an alternative embodiment to FIGS. 1 and 2 showing a top view of an electrical structure 4 comprising an electrical device 15 connected to contact pads 12 on a substrate (organic, ceramic, etc) 10 in accordance with embodiments of the present invention. The contact pads 12 create a radial contact pad footprint on the substrate 10. The electronic structure 4 may include, inter alia, a flip chip plastic ball grid array module (FC-PBGA), an organic chip carrier, a ceramic chip carrier, etc. The electrical device 15 may be any electrical device known to a person of ordinary skill in the art such as, inter alia, a semiconductor chip. Alternatively the electrical device 15 may be, inter alia, a chip carrier with an attached semiconductor chip, an interposer with an attached semiconductor chip, etc. The electrical device 15 is electrically connected to the substrate 10 using an electrical connector (e.g., a Controlled Collapse Chip Connection (C4) solder ball). The substrate 10 may comprise, inter alia, a chip carrier (e.g., an organic chip carrier, a ceramic chip carrier, etc.) or a printed circuit board (e.g., an organic printed circuit board, a ceramic printed circuit board, etc.). The contact pads 12 may be adapted to connect signal, such as input/output (I/O), power, and ground connections for the electrical device 15, to a plurality of conductive wires 8 on the substrate 10. The plurality of conductive wires 8 on the substrate 10 are adapted to carry I/O, power, and ground signals to and from the electrical device 15 from an outside source such as, inter alia, a power supply/source, an electrical device, a microprocessor, etc. The I/O, power, and ground signals may be analog or digital signals. The contact pads 12 are arranged on the substrate 10 in a radial pattern such that contact pads 12 are formed on radial edges 17 of sectors 18 on the substrate 10. Each of the sectors 18 comprise a predetermined angle 22 between the radial edges 17 of each of the sectors 18. The sectors 18 in combination form a circular area 25 on the substrate 10. The contact pads 12 may comprise signal, power, and ground pads located at predetermined positions along the radial edges 17 of the sectors 18 on the substrate 10. The plurality of conductive wires 8 on the substrate 10 are positioned between the radial edges 17 of the sectors 18 on the substrate 10. The radial arrangement of the contact pads 12 provides an increasing amount of space between the contact pads 12 along the radial edges 17 of the sectors 18 as the contact pads 8 are positioned closer to the outer circumference of the circular area 25. Each predetermined angle 22 may be determined based on the number of conductive wires 8 positioned between the radial edges 17 of the sectors 18, the width of each of the conductive wires 8, and the space required between each adjacent conductive wire. The contact pads 12 may be adapted for solder bump, solder ball, or controlled collapse chip connection attachment to the electrical device 15. The substrate 10 may comprise a single wiring layer or a multi-layer wiring layer integrated circuit chip module, a single wiring layer or a multi-layer wiring layer printed circuit board, a single wiring layer or multi-layer wiring layer flexible circuit board, a single wiring layer or a multi-layer wiring layer interposer, a single wiring layer or a multi-layer wiring layer ceramic substrate, a single wiring layer or a multi-layer wiring layer organic substrate. Further, it should be readily apparent that the contact pad footprint on electrical device 15 is a mirror image of the corresponding contact pad footprint of the substrate 10, so when the electrical device 15 footprint is described, the description is applicable to the corresponding contact pad footprint of the substrate 10 and vice versa.

Figure 4:
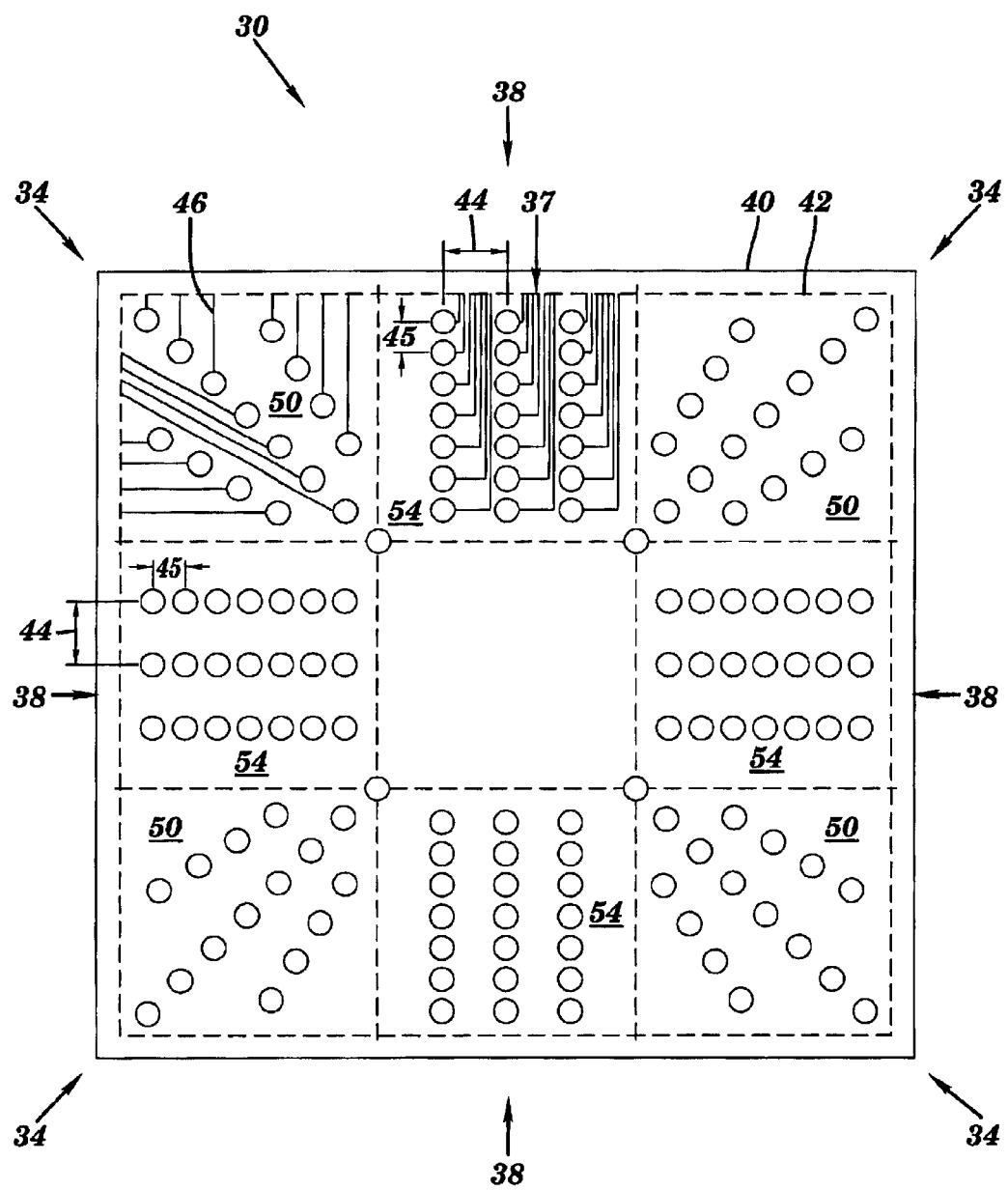
FIG. 4 illustrates an alternative embodiment to FIG. 3 showing a top view of an electrical structure comprising an electrical device connected to two sets of contact pads on a substrate, in accordance with embodiments of the present invention.

FIG. 4 illustrates an alternative embodiment to FIG. 3 showing a top view of an electrical structure 30 comprising an electrical device 42 connected to contact pads 34 in corner sections 50 and contact pads 38 in sections 54 on a substrate 40 (organic, ceramic, etc) in accordance with embodiments of the present invention. The contact pads 34 and the contact pads 38 together create a contact pad footprint on the substrate 40. The electronic structure 30 may include, inter alia, a flip chip plastic ball grid array module (FC-PBGA), an organic chip carrier, a ceramic chip carrier, etc. The electrical device 42 may be any electrical device known to a person of ordinary skill in the art such as, inter alia, a semiconductor chip. Alternatively, the electrical device 42 may be, inter alia, a chip carrier with an attached semiconductor chip, an interposer with an attached semiconductor chip, etc. The electrical device 42 may be electrically connected to the substrate 40 using an electrical connector (e.g., a Controlled Collapse Chip Connection (C4) solder ball). The substrate 40 may comprise, inter alia, a chip carrier (e.g., an organic chip carrier, a ceramic chip carrier, etc.) or a printed circuit board (e.g., an organic printed circuit board, a ceramic printed circuit board, etc.). The contact pads 34 and the contact pads 38 are adapted to connect signal, such as (I/O), power, and ground connections for the electrical device 42, to a plurality of conductive wires 46 and 37 on the substrate 40. The plurality of conductive wires 46 and 37 on the substrate 40 are adapted to carry I/O, power, and ground signals to and from the electrical device 42 from an outside source such as, inter alia, a power supply/source, an electrical device, a microprocessor, etc. The I/O, power, and ground signals may be analog or digital signals. The contact pads 34 on the substrate 40 are located in each of the four corner sections 50 of the substrate 40 and comprise the radial pattern of FIG. 3, thereby allowing a maximum amount of the conductive wires 46 to run from the contact pads 34 to external connections on the substrate 40. In contrast with FIG. 3, the radial pattern of FIG. 4 is only located in the four corner sections 50 of the substrate 40. Note that all other features of the contact pads 34 comprising the radial pattern are the same as the radial pattern if FIG. 3 as described supra. The contact pads 38 located in the sections 54 of the substrate 40 each comprise a dual pitch pattern. The dual pitch pattern places each of the contact pads 38 located in sections 54 a first predetermined distance 44 from each other in a first direction and a second predetermined distance 45 from each other in a second direction. The first predetermined distance 44 is different from the second predetermined distance 45. The first direction is perpendicular to the second direction in each of the four sections 54 of the substrate. A plurality of conductive wires 37 on the substrate 40 are positioned between adjacent contact pads, spaced apart by the first predetermined distance 44. The first predetermined distance 44 is calculated based on the number of conductive wires positioned between the adjacent contact pads in said first direction, the width of each of said conductive wires, and the space required between each adjacent conductive wire. The substrate 40 may comprise a single wiring layer or a multi-layer wiring layer integrated circuit chip module, a single wiring layer or a multi-layer wiring layer printed circuit board, a single wiring layer or a multi-layer wiring layer flexible circuit board, a single wiring layer or a multi-layer wiring layer interposer, a single wiring layer or a multi-layer wiring layer ceramic substrate, a single wiring layer or a multi-layer wiring layer organic substrate. Further, it should be readily apparent that the contact pad footprint on electrical device 42 is a mirror image of the corresponding contact pad footprint of the substrate 40, so when the electrical device 42 footprint is described, the description is applicable to the corresponding contact pad footprint of the substrate 40 and vice versa.

Figure 5:
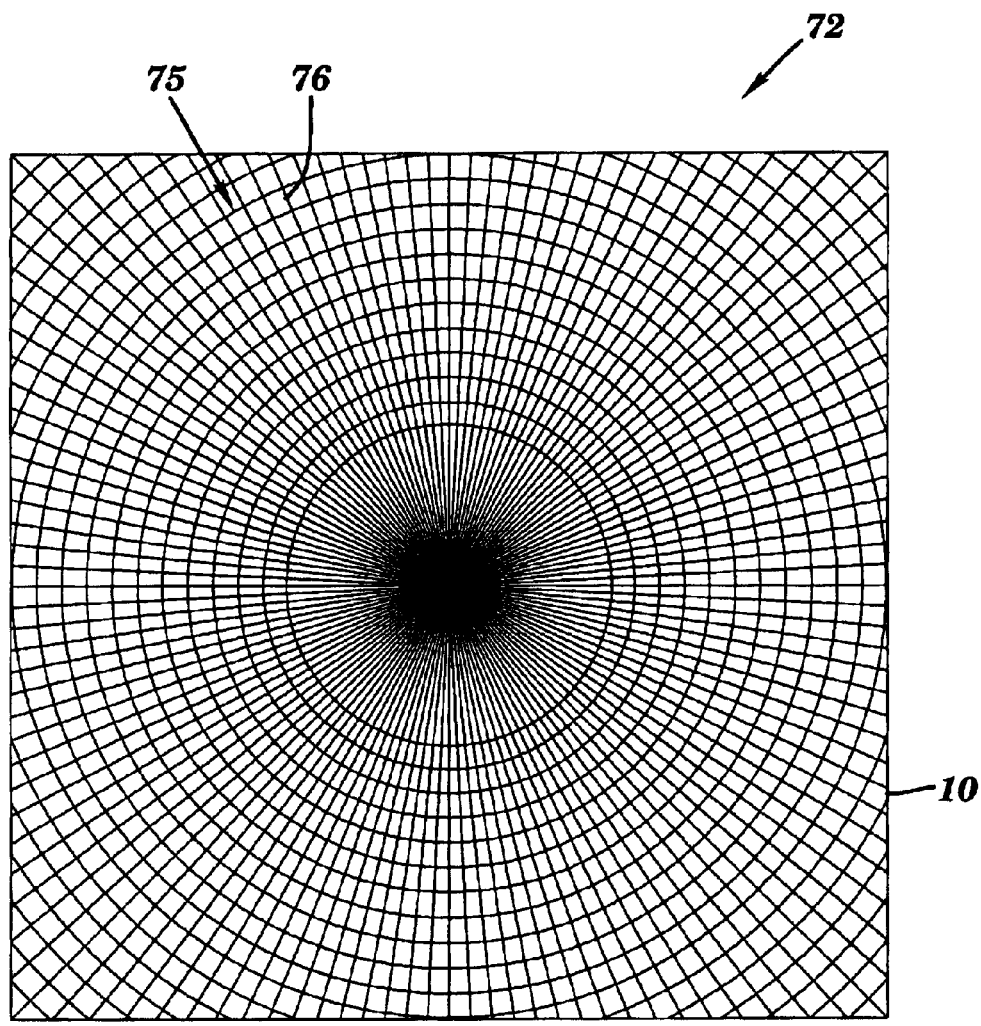
FIG. 5 illustrates a top view of a reference mesh plane, in accordance with embodiments of the present invention.

FIG. 5 illustrates a top view of a substrate 10 including a reference mesh plane 72 comprising a radial pattern in accordance with embodiments of the present invention. A reference mesh plane comprises a plurality of reference conductors used to carry return currents from signal wires (e.g, see wires 8 of FIG. 3 and wires 37 and 46 of FIG. 4) back to a signal source. A reference conductor should be placed in close proximity to each signal wire to minimize crosstalk between each of the signal wires and insure signal integrity. A multilayer substrate (organic, ceramic, etc) may be used with the reference mesh plane 72 so that the signal wires may be placed on a first layer and the reference mesh plane 72 may be placed on a second layer above or a third layer below the signal wires. Alternatively, the reference mesh plane 72 may be placed on the second layer above and the third layer below the signal wires. A reference mesh plane comprises one potential such as, inter alia, power, ground, etc. A reference mesh plane may be used with any contact pad footprint of a substrate including the contact pad footprints of FIGS. 3 and 4. For the contact pad footprint of FIG. 3, the reference mesh plane 72 of FIG. 5 may be used in accordance with embodiments of the present invention. Similarly, fro the contact pad footprint of FIG. 4, the reference mesh plane 84 of FIG. 7 may be used. The reference mesh plane 72 comprises a first group of electrically conductive wires 75 and a second group of electrically conductive wires 76. The first group of electrically conductive wires 75 are formed in a first pattern comprising concentric circles. The second group of electrically conductive wires 76 are formed in a second pattern comprising single lines lying on radii of the concentric circles. The first group of electrically conductive wires 75 are electrically connected to the second group of electrically conductive wires 76, thereby forming a grid. Each of the wires 8 of FIG. 3 may be run coincidence with each of the electrically conductive wires 76 but on separate adjacent vertical layers. Therefore, each of the wires 8 has it's own electrically conductive wire 76 to carry return currents thereby reducing electrical noise and preserving signal integrity.

Figure 6:
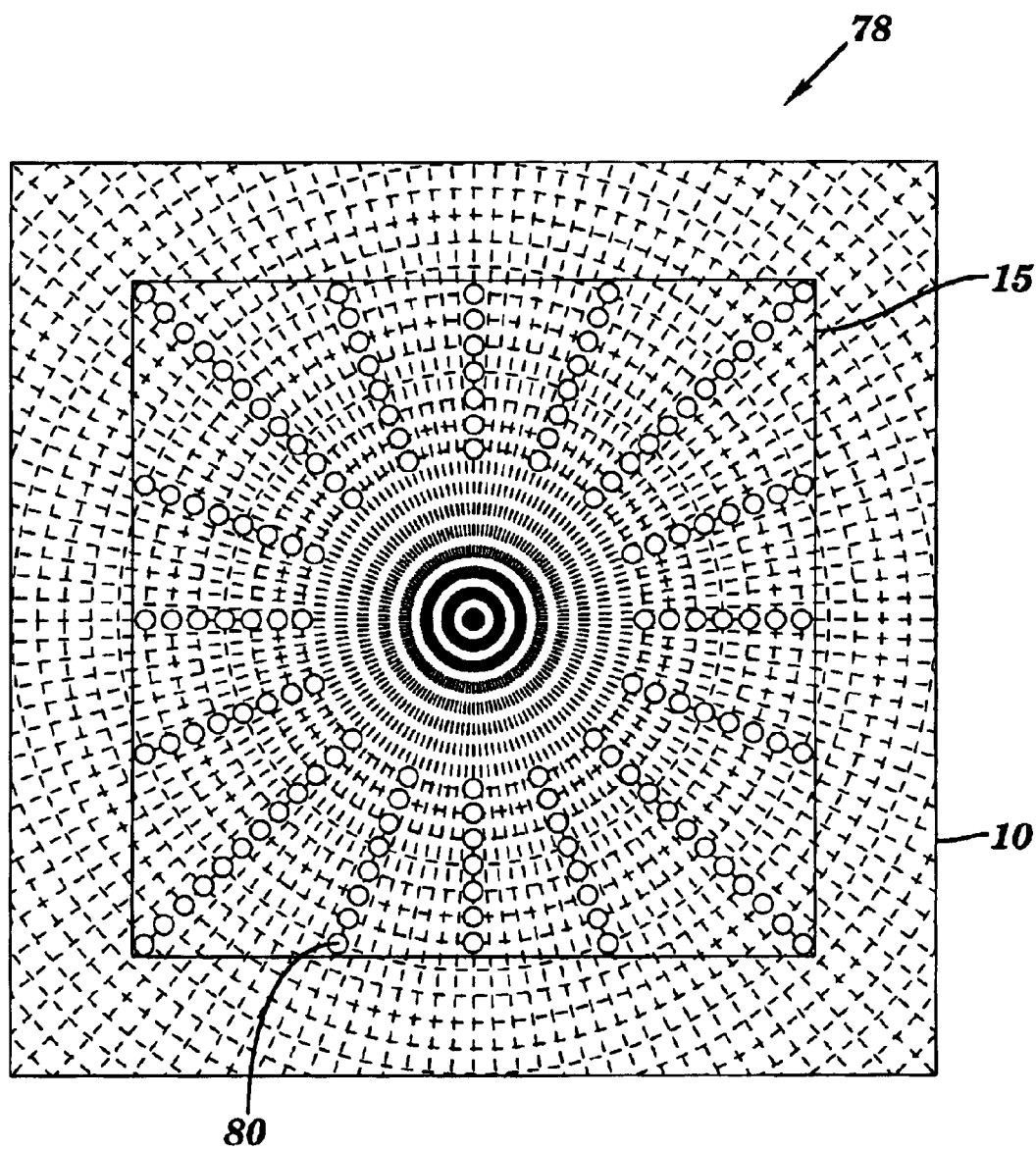
FIG. 6 illustrates a top view of a solid reference plane comprising gas vent holes in accordance with embodiments of the present invention.

FIG. 6 illustrates a top view of a substrate 10 including an electrical device 10 and a solid reference plane 78 comprising a radial pattern of gas vent holes 80 in accordance with embodiments of the present invention. As with the reference mesh plane 72 of FIG. 5, the solid reference plane 78 is used to carry return currents from signal wires (e.g, see wires 8 of FIG. 3 and wires 37 of FIG. 4) back to a signal source. In contrast to the reference mesh plane 72 of FIG. 5, the solid reference plane 78 comprises a solid metal reference conductor instead of a conductive grid. A multilayer substrate (organic, ceramic, etc) may be used with the solid reference plane 78 so that the signal wires may be placed on a first layer and the solid reference plane may be placed on a second layer above or below the signal wires. Alternatively, the solid reference plane 78 may be placed on the second layer above and the third layer below the signal wires. The solid reference plane 78 comprises one potential such as, inter alia, power, ground, etc. The solid reference plane 78 may be used with any contact pad footprint of a substrate including the contact pad footprints of FIGS. 3 and 4. The solid reference plane 78 includes a pattern of holes or openings called gas vent holes 80. The gas vent holes 80 are used to vent or release gasses formed during fabrication of dielectric laminate substrates to insure a proper lamination of layers. "Lamination" of layers, etc is defined herein as adhesively stacking said layers, etc in any manner known to one of ordinary skill in the art. The gas vent holes 80 are placed in a location in the solid reference plane 78 such that the electrically conductive wires 8 of FIG. 3 and the electrically conductive wires 46 and 37 of FIG. 4 are not located above or below the gas vent holes 80. In reference to FIG. 3, the gas vent holes 80 may form the same pattern as the wires 8 but offset to the right or left. In reference to FIG. 4, the gas vent holes 80 may form the same pattern as the wires 46 and 37 but offset to the right or left.

Figure 7:
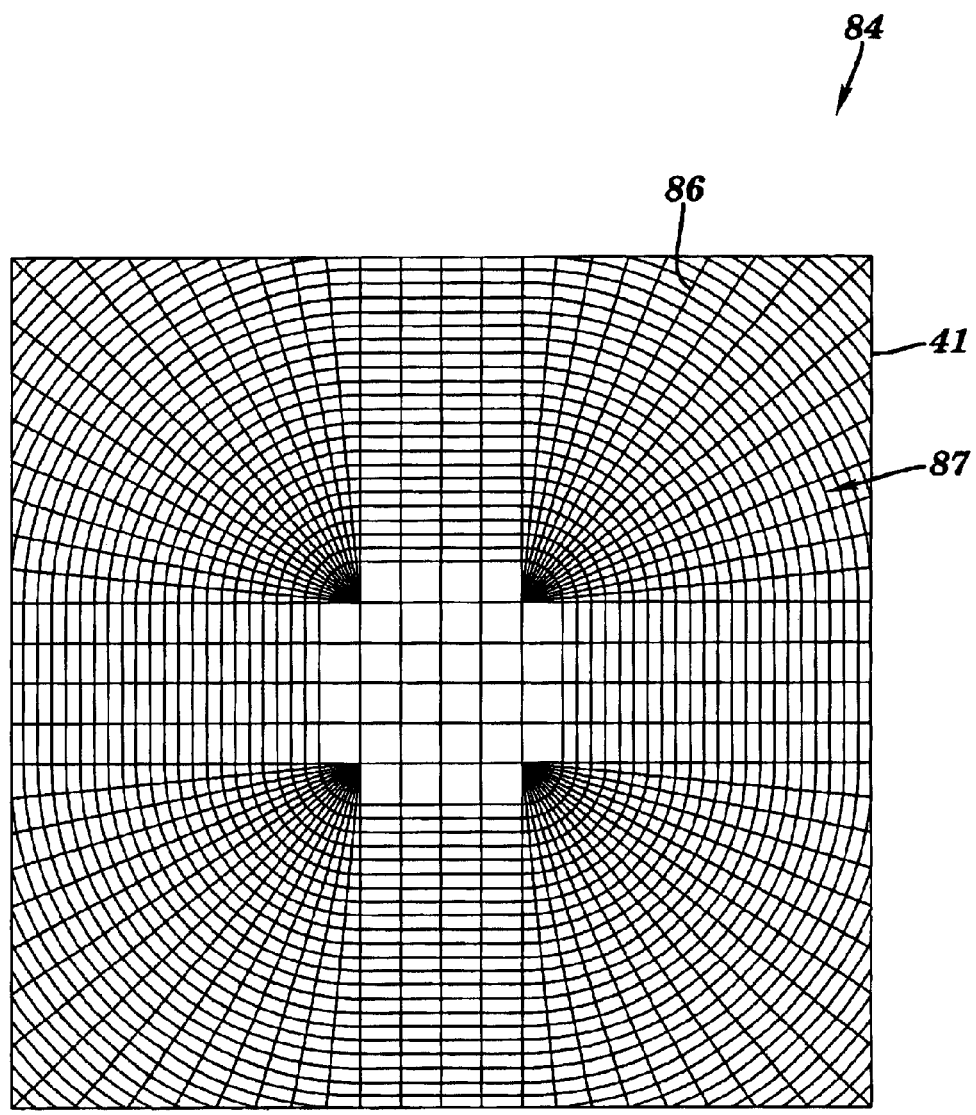
FIG. 7 illustrates an alternative embodiment to the reference mesh plane of FIG. 5 comprising a radial pattern and a dual pitch pattern for the contact pad footprint of FIG. 4, in accordance with embodiments of the present invention.

FIG. 7 illustrates an alternative embodiment to the reference mesh plane 72 of FIG. 5 showing a top view of a substrate 41 including a reference mesh plane 84 comprising a radial pattern and a dual pitch pattern for the contact pad footprint of FIG. 4, in accordance with embodiments of the present invention. In contrast with the reference mesh plane 72 of FIG. 5, the reference mesh plane 84 comprises a similar pattern as a pattern formed by the wires 37 and 45 of FIG. 4. The reference mesh plane 84 comprises a first group of electrically conductive wires 87 and a second group of electrically conductive wires 86. The first group of electrically conductive wires 87 are formed in a first pattern comprising concentric shapes (e.g., an oval shape). The second group of electrically conductive wires 86 are formed in a second pattern comprising single lines lying on radii of the concentric oval shapes. The first group of electrically conductive wires 87 are electrically connected to the second group of electrically conductive wires 86, thereby forming a grid. Each of the wires 46 and 37 of FIG. 4 may be run coincidence with each of the electrically conductive wires 86 but on separate adjacent vertical layers. Therefore, each of the wires 46 and 37 of FIG. 4 has it's own electrically conductive wire 86 to carry return currents, thereby reducing electrical noise and preserving signal integrity.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
    contact pads on a surface of a substrate, wherein the contact pads are adapted to couple signal, power, and ground connections for an electrical device to a plurality of conductive wires on the substrate, wherein the contact pads are formed in single lines along radial edges of sectors on the substrate, wherein each sector comprises a predetermined angle between the radial edges of each of said sectors, wherein the sectors collectively form a circular area, wherein the contact pads comprises signal, power, and ground connections located at predetermined positions on the single lines along the radial edges of each of said sectors, and wherein the plurality of conductive wires on the substrate are positioned between the radial edges of the sectors on the substrate.

2. The electrical structure of claim 1, wherein each predetermined angle is based on a number of conductive wires positioned between the radial edges of each sector, a width of each of said conductive wires, and a space required between adjacent wires of said conductive wires.

3. The electrical structure of claim 1, wherein said contact pads are adapted for solder bump, solder ball, or controlled collapse chip connection attachment to a flip-chip mounted chip.

4. The electrical structure of claim 1, wherein said substrate is selected from the group consisting of a single wiring layer or multi-layer wiring layer integrated circuit chip module, a single wiring layer or multi-layer wiring layer printed circuit board, a single wiring layer or multi-layer wiring layer flexible circuit board, a single wiring layer or multi-layer wiring layer interposer, a single wiring layer or multi-layer wiring layer ceramic substrate, a single wiring layer or multi-layer wiring layer organic substrate.

5. The electrical structure of claim 1, wherein said substrate comprises layers, wherein the contact pads are on a first layer, wherein said substrate further comprises at least one reference mesh plane, wherein the at least one reference mesh plane is on a second layer, wherein the at least one reference mesh plane comprises a first group of conductors and a second group of conductors, wherein the first group of conductors are formed in a first pattern comprising a concentric circles, wherein the second group of conductors are formed in a second pattern comprising single lines lying on radii of said concentric circles, and wherein the first group of conductors are electrically connected to the second group of conductors thereby forming a two-dimensional conductive grid.

6. The electrical structure of claim 1, wherein said substrate further comprises layers, wherein at least one metal reference plane is located between successive layers of the substrate, wherein at least one metal reference plane comprises vent holes adapted to vent gasses generated during fabrication of the substrate, wherein the vent holes comprise a pattern such that the vent holes are formed in single lines along radial edges of sector on the substrate, wherein each of the sectors comprise a predetermined angle between the radial edges of each of said sectors, wherein the sectors collectively form a circular area, and wherein the plurality of conductive wires on the substrate do not pass over or under any of the vent holes.

7. An electrical structure, comprising:
    first contact pads on a surface of a substrate, wherein the first contact pads are adapted to couple signal, power, and ground connections for an electrical device to first plurality of conductive wires on the substrate, wherein the first contact pads are formed in single lines along radial edges of sectors on the substrate, wherein each of the sectors comprise a predetermined angle between the radial edges of each of said sectors, wherein the sectors collectively form a quadrant in each corner of said substrate, wherein the first contact pads comprise said signal, power, and ground connections located at predetermined positions on the single lines along the radial edges of the sectors within each quadrant, and wherein the first plurality of conductive wires are positioned between the radial edges of the sectors; and
    second contact pads on the surface of the substrate, wherein the second contact pads are adapted to couple signal, power, and ground connections for said electrical device to a second plurality of conductive wires on the substrate, wherein the second contacts pads are spaced apart a first predetermined distance in a first direction, wherein the second contact pads are spaced apart a second predetermined distance in a second direction, wherein first predetermined distance is different from said second predetermined distance, wherein the first direction is perpendicular to the second direction, wherein the first and second contact pads are located on different areas on the substrate, and wherein the second plurality of conductive wires are positioned between adjacent contact pads in said first direction.

8. The electrical structure of claim 7, wherein each predetermined angle is based on a number of conductive wires positioned between the radial edges of the sectors, a width of each of said conductive wires, and a space required between each adjacent wire of said conductive wires, and wherein the first predetermined distance is based on a number of conductive wires positioned between said adjacent contact pads in said first direction, a width of each of said conductive wires, and a space required between adjacent wires of said conductive wires.

9. The electrical structure of claim 7, wherein the first contact pads and the second contact pads are adapted for solder bump, solder ball or controlled collapse chip connection attachment to a flip-chip mounted chip.

10. The electrical structure of claim 7, wherein said substrate is selected from the group consisting of a single wiring layer or multi-layer wiring layer integrated circuit chip module, a single wiring layer or multi-layer wiring layer printed circuit board, a single wiring layer or multi-layer wiring layer flexible circuit board, a single wiring layer or multi-layer wiring layer interposer, a single wiring layer or multi-layer wiring layer ceramic substrate, a single wiring layer or multi-layer wiring layer organic substrate.

11. The electrical structure of claim 7, wherein said substrate comprises layers, wherein the contact pads are on a first layer, wherein said substrate further comprises at least one reference mesh plane, wherein the at least one reference mesh plane is on a second layer, wherein the at least one reference mesh plane comprises a first group of conductors and a second group of conductors, wherein the first group of conductors are formed in a first pattern comprising concentric shapes, wherein the second group of conductors are formed in a second pattern comprising a same pattern as a pattern formed by the first plurality of conductive wires and the second plurality of conductive wires, wherein the second group of conductors formed in the second pattern are offset from the first plurality of conductive wires and the second plurality of conductive wires, and wherein the first group of conductors are electrically connected to the second group of conductors thereby forming a two-dimensional conductive grid.

12. The electrical structure of claim 7, wherein said substrate comprises layers, wherein at least one metal reference plane is located between successive layers of the substrate, wherein the at least one metal reference plane comprises vent holes adapted to vent gasses generated during fabrication of the substrate, wherein the plurality of vent holes comprise a first pattern comprising a same pattern as a pattern formed by the first plurality of conductive wires and the second plurality of conductive wires, wherein the vent holes comprising the first pattern are offset from the first plurality of conductive wires and the second plurality of conductive wires, and wherein the first plurality of conductive wires and the second plurality of conductive wires on the substrate do not pass over or under any of the vent holes.

13. A method for forming an electrical structure, comprising:
   forming contact pads on a surface of a substrate, wherein the contact pads are adapted to couple signal, power, and ground connections for an electrical device to a plurality of conductive wires on the substrate, wherein the contact pads are formed in single lines along radial edges of sectors on the substrate, wherein each sector comprises a predetermined angle between the radial edges of each of said sectors, wherein the sectors collectively form a circular area, and wherein the contact pads comprise signal, power, and ground connections located at predetermined positions on the signal lines along the radial edges of each of said sectors; and
   positioning the plurality of conductive wires on the substrate between the radial edges of the sectors on the substrate.

14. The method of claim 13, further comprising calculating each predetermined angle based on number of conductive wires positioned between the radial edges of the sectors, a width of each of said conductive wires, and a space required between adjacent wires of said conductive wires.

15. The method of claim 13, wherein said substrate is selected from the group consisting of a single wiring layer or multi-layer wiring layer integrated circuit chip module, a single wiring layer or multi-layer wiring layer printed circuit board, a single wiring layer or multi-layer wiring layer flexible circuit board, a single wiring layer or multi-layer wiring layer interposer, a single wiring layer or multi-layer wiring layer ceramic substrate, a single wiring layer or multi-layer wiring layer organic substrate.

16. The method of claim 13, further comprising forming at least one reference mesh plane on a first layer of the substrate, and
   forming the contact pads on a second layer of the substrate, wherein the at least one reference mesh plane comprises a first group of conductors and a second group of conductors, wherein the first group of conductors are formed in a first pattern comprising concentric circles, wherein the second group of conductors are formed in a second pattern comprising single lines lying on radii of said concentric circles, and wherein the first group of conductors are electrically connected to the second group of conductors thereby forming a two-dimensional conductive grid.

17. The method of claim 13, further comprising forming the substrate comprising layers, wherein at least one metal reference plane is located between successive layers of the substrate, wherein at least one metal reference plane comprises vent holes adapted to vent gasses generated during fabrication of the substrate, wherein the vent holes comprise a pattern such that the vent holes are formed in single lines along radial edges of the sectors on the substrate, wherein each of the sectors comprise a predetermined angle between the radial edges of each of said sectors, wherein the sectors collectively form a circular area, and wherein the plurality of conductive wires on the substrate do not pass over or under any of the vent holes.

* * * * *